United States Patent
Ernst

(10) Patent No.: US 8,258,724 B2
(45) Date of Patent: Sep. 4, 2012

(54) VARIABLE INDUCTOR AS DOWNHOLE TUNER

(75) Inventor: Vincent Ernst, Pennington, NJ (US)

(73) Assignee: Schlumberger Technology Corporation, Sugar Land, TX (US)

( * ) Notice: Subject to any disclaimer, the term of this patent is extended or adjusted under 35 U.S.C. 154(b) by 530 days.

(21) Appl. No.: 11/854,267

(22) Filed: Sep. 12, 2007

(65) Prior Publication Data

US 2009/0066269 A1   Mar. 12, 2009

(51) Int. Cl.
*H01J 23/34* (2006.01)
(52) U.S. Cl. .............. 315/507; 315/504; 315/111.51
(58) Field of Classification Search .......... 315/500–507; 334/71
See application file for complete search history.

(56) References Cited

U.S. PATENT DOCUMENTS

| | | | |
|---|---|---|---|
| 720,884 A | 2/1903 | Burgess et al. | |
| 3,975,689 A | 8/1976 | Geizer et al. | 328/237 |
| 4,577,156 A * | 3/1986 | Kerst | 315/504 |
| 5,077,530 A | 12/1991 | Chen | 328/233 |
| 5,122,662 A | 6/1992 | Chen et al. | 250/269 |
| 5,319,314 A | 6/1994 | Chen | 328/237 |
| 5,426,409 A | 6/1995 | Johnson | 336/178 |
| 6,121,850 A | 9/2000 | Ghoshal | 331/181 |
| 6,184,662 B1 * | 2/2001 | Yabuuchi et al. | 323/222 |
| 2003/0192644 A1 * | 10/2003 | Pu et al. | 156/345.28 |

OTHER PUBLICATIONS

K. Harada, "Silicon Controlled Rectifier with Parametric Phase Shifter," IEEE Transactions on Magnetics, Dec. 1965, vol. Mag-1(4): pp. 391-395.

* cited by examiner

*Primary Examiner* — Douglas W Owens
*Assistant Examiner* — Jianzi Chen

(57) ABSTRACT

A tunable LC circuit is used to trigger an electron discharge from an accelerator device, such as a Betatron. The circuit includes a coil as a first inductor having a first inductance electrically coupled in series with a capacitor. A second inductor having a variable inductance is electrically coupled, either in series or parallel, to the first inductor. The time to capacitor discharge is governed by:

$$\tau_{LC} = \sqrt{(L+L_{TUNE})C}.$$

Adjusting the inductance of the variable inductor ($L_{TUNE}$) facilitates continuous adjustment of the discharge time. This is particularly useful when the LC values change in response to external stimuli, such as borehole temperature when a Betatron is used to log borehole features.

10 Claims, 3 Drawing Sheets

VARIABLE INDUCTOR AS DOWNHOLE TUNER

BACKGROUND

1. Field

Disclosed are methods and circuits for adjusting the time constant of an LC circuit to maintain stable electron energy and minimize power losses in an accelerator device, such as a Betatron.

2. Description of the Related Art

Betatrons are magnetic devices used to accelerate electrons to relativistic energies. A high energy electron beam is extracted and directed on a suitable target, generating high energy x-rays. One application of the high energy x-rays is for logging oilfield boreholes, such as to map subsurface density and lithology.

Effective operation of a Betatron requires high, pulsed, currents and voltages to generate the magnetic field necessary for acceleration and confinement of the electrons. The Betatron device is controlled and run by several power supplies, which form the Betatron modulator. A conventional Betatron driving circuit utilizes a high voltage D.C. power supply, coupled to a pulse generating modulator circuit, which in turn drives the Betatron coils. U.S. Pat. No. 5,077,530 to Chen discloses a Betatron driving circuit having a combination of a low voltage D.C. power supply and a high voltage excitation capacitor to drive the Betatron. U.S. Pat. No. 5,077,530 is incorporated by reference herein in its entirety.

Proper timing is needed to maintain stable electron energy and to minimize power losses. The time constant, $\tau_{LC}$, is the time required for the current to rise from a base value to a peak value during a single duty cycle:

$$\tau_{LC} = t_1 - t_3 \quad (1)$$

As illustrated in FIG. 3, $t_1$ is the time when current begins to rise and $t_3$ is the time peak current is reached. A typical $\tau_{LC}$ for a Betatron modulator on the order of 20-40μseconds. $\tau_{LC}$ is mainly determined by the time constant combination L and C (reference numerals 10 and 12 in FIG. 1).

$$\tau_{LC} = \sqrt{LC} \quad (2)$$

Varying either L or C, controls the length of this time interval. However, the LC time constant is affected by manufacturing tolerances and by component variations as a function of temperature. Temperature variations in a borehole are particularly extreme and may differ by on the order of 250° C. from the surface to the bottom of the borehole. Because of this, existing Betatron modular circuits cannot be accurately tuned to the precise time at which the peak of the current is reached and even if tuned at the surface, go off-peak due to temperature fluctuations. An additional source of heat that could increase the temperature variation is electrical resistance of the circuit components.

One way to tune an LC circuit is by using a capacitor bank with different value capacitors and a switch to connect the appropriate capacitor (or combination thereof) in series with or parallel to inductor L. Another way to tune LC circuits is disclosed in U.S. Pat. No. 6,121,850 to Ghosal that discloses a digitally adjustable inductive element utilized to provide a tunable oscillator.

A tunable inductor is disclosed in U.S. Pat. No. 5,426,409 to Johnson, which is incorporated by reference herein in its entirety. The tunable inductor has a magnetically saturable core with a pair of outer limbs joined to a center limb by connecting limbs. Signal winding are formed about each outer limb and a signal source connected to the signal windings induces a signal flux in the core through the outer limbs. A bias winding formed around the center limb induces a variable bias flux into the core. The flux induced by the signal windings is maintained below saturation. Adding flux via the bias winding controllably changes the inductance of the variable inductor. By applying a varying control current, we can move to a different section of the B-H curve, thereby obtaining a different amount of change in flux density provided by the same amount of variation of magnetization force.

BRIEF SUMMARY

The details of one or more embodiments are set forth in the accompanying drawings and the description below. Other features, objects and advantages will be apparent from the description and drawings, and from the claims.

Disclosed below is tunable LC circuit that may be used obtain precise timing for electron beam injection and extraction from an accelerator device, such as a Betatron. The circuit includes a first inductor having a first inductance electrically coupled in series with a capacitor. A second inductor having a variable inductance is electrically coupled, either in series or parallel, to the first inductor. Recognizing that the time to capacitor discharge is governed by:

$$\tau_{LC} = \sqrt{(L + L_{TUNE})C}$$

adjusting the inductance of the variable inductor ($L_{TUNE}$) facilitates continuous adjustment of the discharge time. This is particularly useful when the LC values change in response to external stimuli, such as borehole temperature when a Betatron is used to log borehole features.

BRIEF DESCRIPTION OF THE DRAWINGS

Like reference numbers and designations in the various drawings indicated like elements.

DETAILED DESCRIPTION

Figure 1:
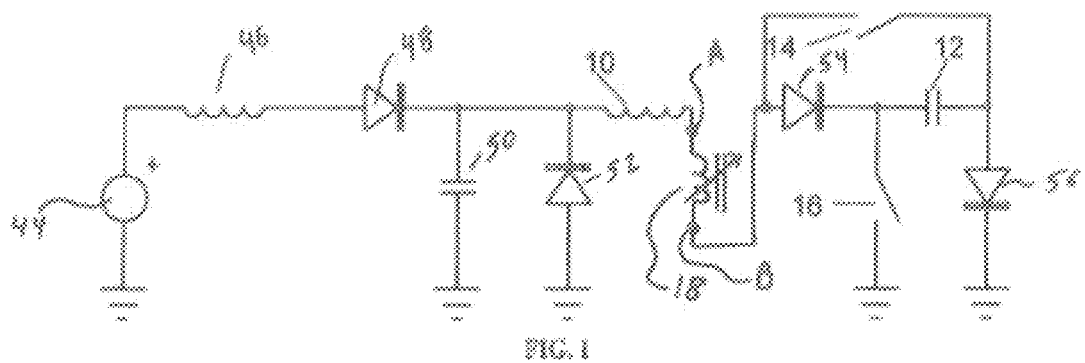
FIG. 1 is a first embodiment of a modulator circuit for Betatron.

FIG. 1 illustrates a modulator circuit for a Betatron. Components of this modulator circuit include low voltage D.C. power supply 44, a low voltage capacitor 50, a high voltage capacitor 12 and a Betatron coil 10. The capacitance of the low voltage capacitor 50 is much greater than the capacitance of the high voltage capacitor 12, nominally on a scale of 100 times higher. The Betatron coils 10 having a first inductance, are coupled in an LC oscillating relationship between the low voltage capacitor 50 and the high voltage capacitor 12. The Betatron coils form a portion of the L component of an LC circuit. High voltage storage capacitor 12 forms the C component. When switches 14, 16 are closed, a current starts flowing through the Betatron coils 10. A variable inductor 18 in series with Betatron coils 10 controls the timing by adjusting the inductance L of the coils and thus the time constant of the LC circuit. The time constant is now given by:

$$\tau_{LC} = \sqrt{(L + L_{TUNE})C} \quad (3)$$

The time constant of the LC circuit can now be continuously adjusted to compensate for manufacturing tolerances and temperature effects of the modulation frequency of the Betatron device by constantly measuring the time interval $t_1$-$t_3$ and assuring that this interval remains constant.

Figure 2:
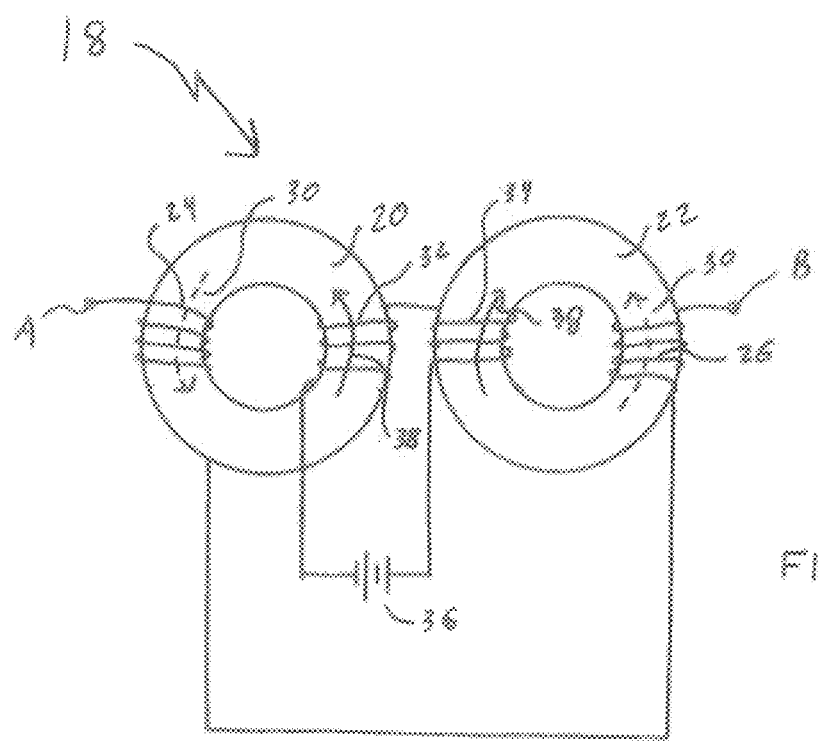
FIG. 2 illustrates an exemplary saturable inductor as known from the prior art.

Any suitable variable inductor that is continuously variable over a range of desired inductances may be utilized. An exemplary variable inductor 18 is illustrated in FIG. 2 and includes a first core 20 and second core 22 both formed from a highly permeable material. The desired range of inductance preferably includes the saturation point of the variable inductor 18. A first signal winding 24 around first core 20 and a second signal winding 26 around a second core 22 are connected inducing a signal flux 30. A first control winding 32 around the first core 20 and a second control winding 34 around the second core 22 are connected to a DC power source 36 inducing a control flux 38. Connection points A and B align with connection points A and B in FIG. 1 to illustrate an embodiment of how the variable inductor 18 may be fit into the modulator circuit.

Figure 3:
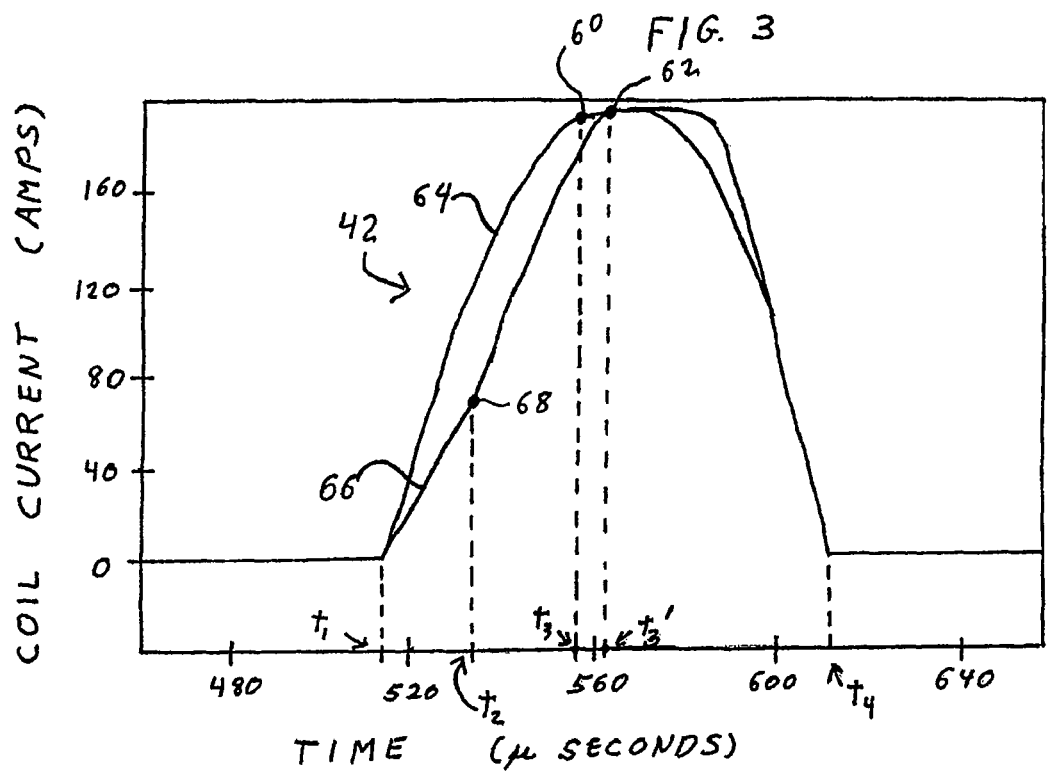
FIG. 3 graphically illustrates how the saturable inductor adjusts the time constant, $\tau_{LC}$.

FIG. 3 illustrates how changing the rate of current rise slope 42 changes the time to peak current from peak 60 ($t_3$) to peak 62 ($t_3'$). Line 64 represents a modulator circuit without a variable inductor, or with the variable inductor at saturation. The time constant of the rise of current is governed by Equation (2) above. Line 66 represents a modulator circuit including an unsaturated variable inductor. The time constant of the rise of the current is governed by Equation (3) above from $t_1$ until $t_2$, when the variable inductor reaches saturation. At $t_2$, the saturable inductor saturates and its inductance becomes effectively 0. When this happens, Equation (3) reduces to Equation (2) and the rise of current proceeds from $t_2$ until $t_3$ as if the saturable inductor were not present. Likewise, the time constant of the current fall, from $t_3$ to $t_4$ is governed for both line 64 and line 66 by Equation (2).

The inflection point 68 at time, $t_2$, where the rate of rise of the current changes, can be adjusted by adjusting the bias current or voltage level of DC power supply 36 (FIG. 2) of the variable inductor. At the point of saturation, the inductance collapses and the saturable inductor acts as a short circuit. Consequently, when a variable inductor is in the circuit, for time interval $t_1$-$t_2$ the time constant is governed by Equation (3) and for time intervals $t_2$-$t_3$ and $t_3$-$t_4$ the time constant is governed by Equation (2). It is noted that the shift in time until peak current, i.e. from 60 to 62 in FIG. 3, is due to the change in rate of current rise and may be achieved even if the variable inductor does not saturate, i.e. there is no inflection point 68.

A feedback loop may monitor $t_3$ and the desired time to peak current. If these two values diverge, the inductance of the variable inductor may be varied to return the values to convergence. A sensor may monitor external data that would influence the timing, such as Betatron temperature, and cause the variable inductance to be varied in response to this external data.

Figure 4:
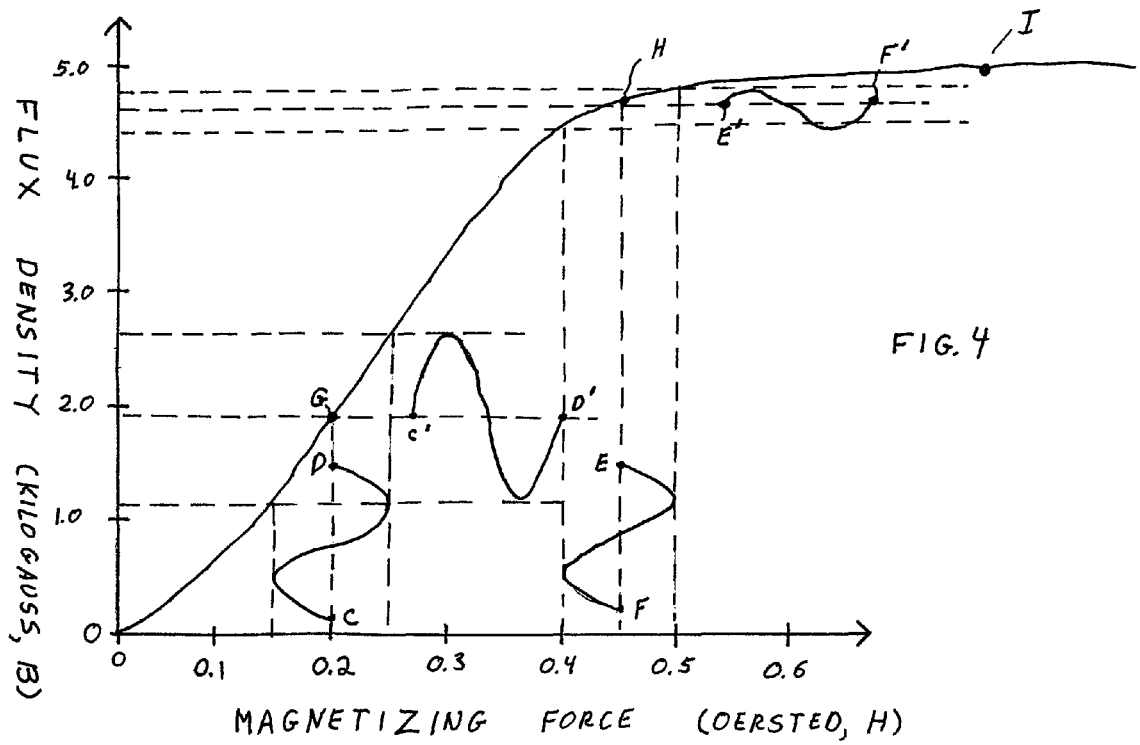
FIG. 4 graphically illustrates how a saturable inductor facilitates movement along a B-H curve (Flux Density, B, as a function of Magnetizing Force, H).

FIG. 4 illustrates how a change in magnetizing force, H, influences the flux density, B, in a saturable inductor. When relatively removed from saturation, a change in magnetizing force has a more significant impact on flux density, than close to saturation. Curves C-D and C'-D' show that when removed from saturation, a 0.1 oersted change in magnetizing force results in approximately a 1.3 kilogauss change in flux density. Curves E-F and E'-F' show that close to saturation, a 0.1 oersted change in magnetizing force results in approximately a 0.4 kilogauss change in flux density. This indicates that finer tuning of the inductance is possible when close to saturation. The distance between the pre-bias points (G or H) and the saturation point I determines the $t_1$-$t_3$ interval.

Figure 5:
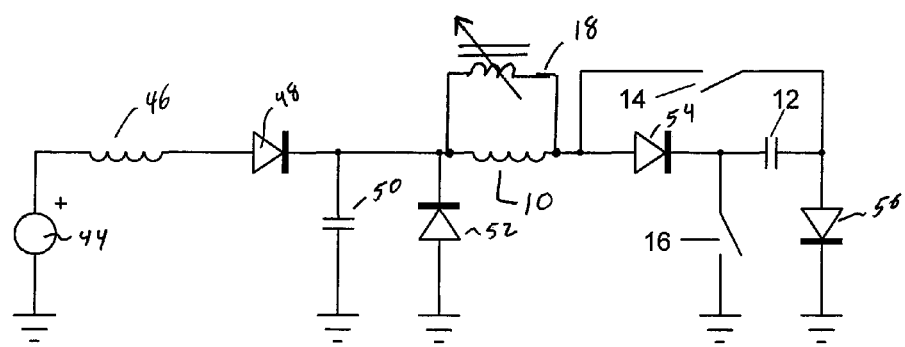
FIG. 5 is a second embodiment of a modulator circuit for Betatron.

In an alternative embodiment that is illustrated in FIG. 5, the variable inductor 18 is in parallel with the Betatron coil 10 that requires tuning. The time constant for this implementation is given by:

$$\tau_{LC} = \sqrt{\left(\frac{L \cdot L_{TUNE}}{L + L_{TUNE}}\right)C} \quad (4)$$

In this embodiment, Equation 4 governs the time constant for $t_1$-$t_2$ and Equation 2 governs the time constant for $t_2$-$t_3$.

The circuits of FIGS. 1 and 5 are useful with components having a wide range of values. Following are exemplary ranges:

| | | |
|---|---|---|
| 44 | Power Supply | 40 volts |
| 46 | Isolation Choke | small inductance, optional |
| 48, 52, 54, 56 | Diode | 1200 V, 200 A |
| 50 | Low Voltage Storage Capacitor | 600 µf, 60 V |
| 10 | Betatron Coils | 100-135 µH |
| 18 | Variable Inductor | variable, 0-10 µH |
| 12 | High Voltage Storage Capacitor | 1200 V, 5 µF |
| 36 | D.C. Source | 0-10 A |

One or more embodiments of the present invention have been described. Nevertheless, it will be understood that various modifications may be made without departing from the spirit and scope of the invention. For example, the disclosed circuits could also be used for tuning antennas for nuclear magnetic resonance, coils for induction tools or antennas for propagation tools. Accordingly, other embodiments are within the scope of the following claims.

What is claimed is:

1. A method for tuning an LC circuit for controlling acceleration of electrons within a Betatron, comprising:
   coupling a first inductor with a capacitor;
   coupling a second inductor with said first inductor wherein said second inductor has a magnetically saturable core with an electrically conductive insulated signal winding about portions of the core to magnetically couple a signal current to the second inductor and winding an electrically conductive insulated bias around said core to magnetically couple a bias current to the second inductor; and
   varying the inductance of the second inductor to achieve a current pulse having a desired time from minimum to maximum to assist in one of keeping an accelerating current stable, a stabilized time constant of the tunable LC circuit or both, for controlling at least one of electron beam injection and extraction from said Betatron.

2. The method of claim 1 wherein said electrically conductive insulated bias winding is connected to a variable D.C. power supply effective to provide a current sufficient to cause said second inductor to saturate.

3. The method of claim 2 wherein said first inductor is in series with said capacitor.

4. The method of claim 1, further comprising varying the inductance of the second inductor based on one or more external input including at least one of temperature, energy or timing.

5. A method to tune a Betatron coil having at least one magnetizing winding of first inductance in an LC timing circuit to accelerate electrons, the method comprising the steps of:

coupling a capacitor in series with said at least one magnetizing winding;

coupling a second inductor having a variable inductance to said at least one magnetizing winding so as to provide for continuous adjustment based on one or more external input including at least one of temperature, energy or timing, which assists in one of keeping an accelerating current stable, a stabilized time constant of the LC timing circuit or both;

providing a source of A.C. current to said LC timing circuit; and adjusting the variable inductance to achieve a desired time to peak current, the time to peak current controlling acceleration of electrons within the Betatron, for controlling at least one of electron beam injection and extraction from the Betatron.

6. The method of claim 5 wherein said variable inductance is continuously adjusted in response to external data.

7. The method of claim 6 wherein said external data includes Betatron coil temperature.

8. The method of claim 6 wherein said second inductor is coupled to said at least one magnetizing winding and said capacitor in series.

9. The method of claim 6 wherein said second inductor is coupled to said at least one magnetizing winding in parallel.

10. The tunable LC circuit of claim 5 wherein the Betatron coil assists in one of keeping a time between an X-ray burst constant, shaping of the electron accelerating current, or both.

* * * * *